United States Patent
Yun et al.

(10) Patent No.: US 8,928,204 B2
(45) Date of Patent: Jan. 6, 2015

(54) PIEZOELECTRIC VIBRATION MODULE

(75) Inventors: Dae Woong Yun, Gyunggi-do (KR); Dong Sun Park, Gyunggi-do (KR); Jae Kyung Kim, Gyunggi-do (KR); Joon Choi, Gyunggi-do (KR); Yeon Ho Son, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 352 days.

(21) Appl. No.: 13/546,330

(22) Filed: Jul. 11, 2012

(65) Prior Publication Data
US 2013/0300255 A1    Nov. 14, 2013

(30) Foreign Application Priority Data
May 8, 2012    (KR) .......................... 10-2012-0048709

(51) Int. Cl.
*H01L 41/053*    (2006.01)

(52) U.S. Cl.
USPC ...... 310/323.01; 310/324; 310/328; 310/330; 310/348

(58) Field of Classification Search
CPC .... B06B 1/0685; G01K 11/002; G01K 9/122; G10K 11/165; H04R 17/00; H01I 41/0926
USPC ........... 310/323.01, 324, 327, 328, 329, 330, 310/348
See application file for complete search history.

(56) References Cited

U.S. PATENT DOCUMENTS

| | | | |
|---|---|---|---|
| 6,927,528 B2* | 8/2005 | Barillot et al. | 310/325 |
| 7,180,225 B2* | 2/2007 | Sashida et al. | 310/330 |
| 8,406,438 B2* | 3/2013 | Ihl et al. | 381/190 |
| 2008/0136292 A1* | 6/2008 | Thiesen | 310/334 |
| 2010/0079039 A1* | 4/2010 | Lampenscherf et al. | 310/367 |

FOREIGN PATENT DOCUMENTS

KR    1020110060558    8/2011

* cited by examiner

*Primary Examiner* — Derek Rosenau
*Assistant Examiner* — Bryan Gordon
(74) *Attorney, Agent, or Firm* — Ladas & Parry, LLP

(57) ABSTRACT

Disclosed herein is a piezoelectric vibration module including a vibration plate that is surrounded by an upper case and a lower case, and includes a first stopper capable of preventing direct collision between a piezoelectric element and an internal constituent member, for example, an upper plate while vibrating linearly therein. In particular, the piezoelectric vibration module may further include a second stopper in the lower case.

18 Claims, 5 Drawing Sheets

PIEZOELECTRIC VIBRATION MODULE

CROSS REFERENCE TO RELATED APPLICATION

This application claims the benefit of Korean Patent Application No. 10-2012-0048709, filed on May 8, 2012, entitled "Piezoelectric Vibration Module", which is hereby incorporated by reference in its entirety into this application.

BACKGROUND OF THE INVENTION

1. Technical Field

The present invention relates to a piezoelectric vibration module.

2. Description of the Related Art

In general, in portable electronic apparatuses such as a cellular phone, an electronic book (E-book) terminal, a game machine, a PMP, and the like, a vibration function is used for various purposes.

In particular, a vibration generator for generating vibration is primarily mounted on the portable electronic apparatuses to be used as a warning function which is a silent receiving signal.

Due to implementation of multi-functions of the portable electronic apparatuses, the vibration generator actually requires miniaturization, integration, and various high-functionality at present.

Furthermore, a touch type device has been generally adopted, which performs an input operation by touching the portable electronic apparatus according to a user's request to intend to conveniently use the portable electronic apparatus.

A haptic device which is currently in common use widely includes even a concept of reflecting interface user's intuitive experience and further diversifying a feedback for a touch in addition to a concept of performing an input operation through the touch. The haptic device is disclosed in Patent Document 1.

A touch screen device disclosed in Patent Document 1 includes a piezoelectric actuator and a first damper member as already widely known.

The piezoelectric actuator is used as a vibration generating means and is mounted on the bottom of a plate to generate vibration, whereas the first damper member is placed to minimize a damage caused due to a collision between a set mechanism unit forming a lower part of the touch screen device and the vibration generating means.

The first damper member can prevent vibration transferred to a touch display module as the vibration is transferred to the set mechanism unit from being reduced and prevents a damage due to contact impact between the vibration generating means and the set mechanism unit.

The piezoelectric vibration module disclosed in Patent Document 1 having the above structure cannot but have a limit in that a characteristic of the piezoelectric actuator which moves in parallel independently in a vertical direction is not considered.

PRIOR ART DOCUMENT

Patent Document (Patent Document 1) Patent Document 1: Korean Patent Laid-Open Publication No. 10-2011-0060558

SUMMARY OF THE INVENTION

The present invention has been made in an effort to provide a piezoelectric vibration module that can prevent direct collision with internal constituent members due to external shock of a piezoelectric element and/or unexpected large driving variation of the piezoelectric element when the piezoelectric element is activated.

According to a first preferred embodiment of the present invention, there is provided a piezoelectric vibration module, including: a piezoelectric element generating vibration force through repetition of extension and shrinkage deformation by applying external power; an upper case having a bottom surface opened and an inner space formed therein so that the piezoelectric element vibrates linearly; a lower case coupled to the bottom surface of the upper case and shielding the inner space of the upper space; and a vibration plate including a flat lower plate mounted with the piezoelectric element, a pair of upper plates that stand vertically upward at the centers of the both sides of the lower plate, and a first stopper between the upper plate and the lower plate, which is placed in the upper case and the lower case and driven vertically.

The vibration plate may further include a weight body between the pair of upper plates in order to increase vibration force of the piezoelectric element.

The length of the first stopper may extend shorter than a spaced distance between the upper plate and the lower plate.

The first stopper may protrude vertically downward on the bottom surfaces of both ends of the upper plate.

The first stopper may protrude vertically upward on the top surfaces of both ends of the lower plate.

The first stopper may protrude on one upper plate of the pair of upper plates.

The first stopper may be arranged by crossing between the pair of upper plates that are arranged in parallel with each other.

The first stopper may be made of the same material as the vibration plate.

The first stopper may be made of a rigid material.

According to a second preferred embodiment of the present invention, there is provided a piezoelectric vibration module, including: a piezoelectric element generating vibration force through repetition of extension and shrinkage deformation by applying external power; an upper case having a bottom surface opened and an inner space formed therein so that the piezoelectric element vibrates linearly; a lower case coupled to the bottom surface of the upper case and shielding the inner space of the upper case; and a vibration plate including a flat lower plate mounted with the piezoelectric element and a pair of upper plates that stand vertically upward at the centers of the both sides of the lower plate, which is placed in the upper case and the lower case and driven vertically.

The lower case may further include protrusions that protrude vertically upward at both ends thereof.

The vibration plate may further include a first stopper placed between the upper plate and the lower plate.

A second stopper may be placed at both ends of the lower case.

The second stopper may be placed at the center of the longitudinal direction of the lower case.

The second stopper may extend shorter than a spaced distance between the lower plate and the lower case, whereas preferably, the second stopper may extend more than the thickness of the piezoelectric element.

The second stopper may be made of the same material as the vibration plate.

The second stopper may be made of a rigid material.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
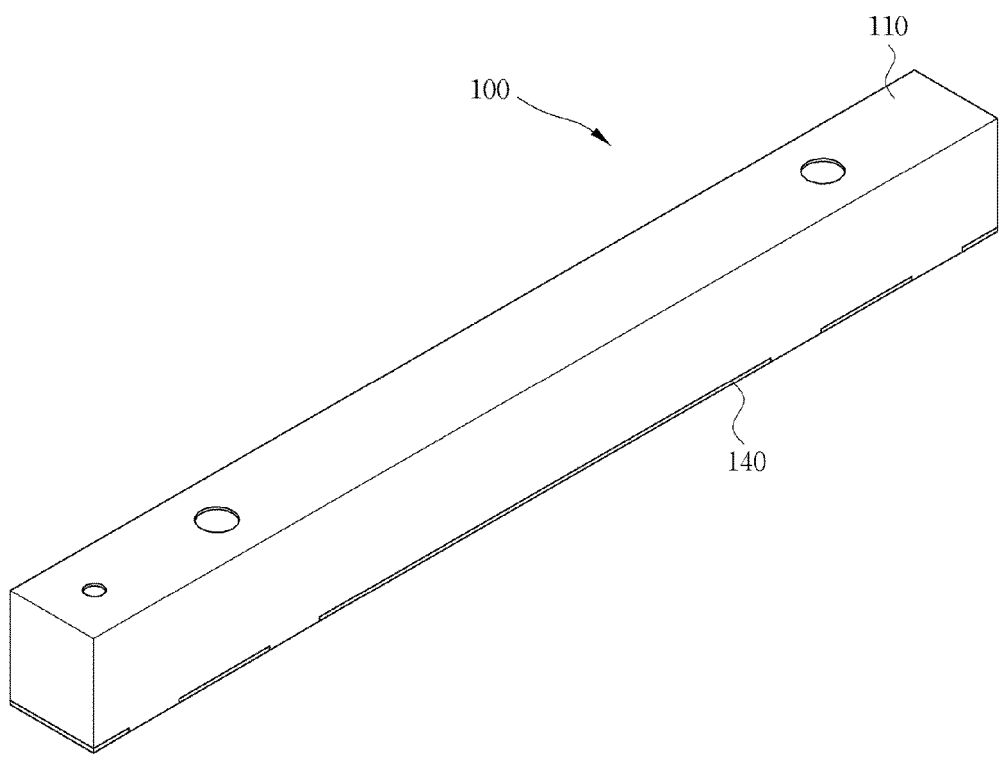
FIG. 1 is a perspective view of a piezoelectric vibration module according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 2:
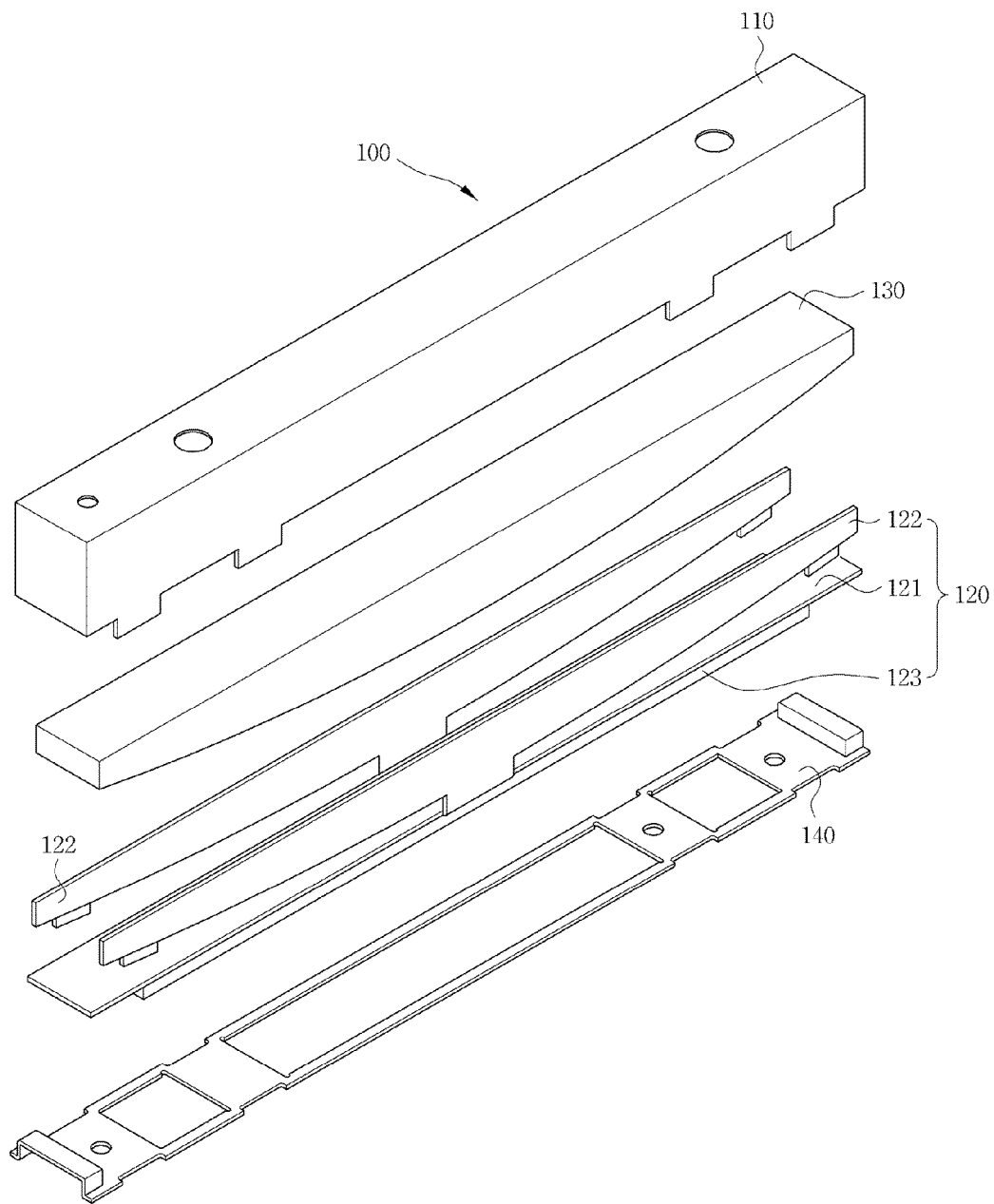
FIG. 2 is an exploded perspective view of the piezoelectric vibration module illustrated in FIG. 1.

FIG. 1 is a perspective view of a piezoelectric vibration module according to a first preferred embodiment of the present invention. FIG. 2 is an exploded perspective view of the piezoelectric vibration module illustrated in FIG. 1.

As illustrated in the figures, the piezoelectric vibration module 100 according to the first preferred embodiment of the present invention includes an upper case 101, a vibration plate 120, a weight body 130, and a lower case 140. The piezoelectric vibration module 100 is used as a means for transferring vibration force to a touch screen panel (not illustrated).

The upper case 100 has a box shape in which one surface is opened and receives a driving body, that is, the vibration plate 120 mounted with a piezoelectric element 123.

The vibration plate 120 transfers vibration force of the piezoelectric element 123 to external components by a bending operation through repetition of extension and shrinkage transformation integrally with the piezoelectric element 123 as described above and includes a flat lower plate 121. The piezoelectric element 123 is mounted on one flat surface of the lower plate 121 and the weight body 130 is placed on the other surface of the lower plate 121. The vibration plate 120 may include a printed circuit board (PCB) (not illustrated) that applies power for driving the piezoelectric element 123.

Alternatively, the vibration plate 120 may include a pair of upper plates 122 that stand vertically upward on both sides of the lower plate 121 together with the flat lower plate 121 as described above. The upper plate 122 is coupled to the center of the lower plate 121. Each of the to lower plate 121 and the upper plate 122 may be formed as a single integral component and may be fixedly coupled by various bonding methods other than mentioned above.

The vibration plate 120 is made of a metallic material having elastic force, for example, SUS to be transformed integrally with the piezoelectric element 123 which repeatedly extends or shrinks according to application of external power. When the vibration plate 120 and the piezoelectric element 123 are coupled to each other by the bonding coupling method, the vibration plate 120 may be made of invar which is a material having a similar thermal expansion coefficient as the piezoelectric element so as to prevent a bending phenomenon which may occur by hardening of a bonding member.

As described above, the vibration plate 120 is made of invar having the similar thermal expansion coefficient as the piezoelectric element 123, such that thermal stress is reduced, which is generated when the piezoelectric element 123 operates or is subjected to thermal shock even under a high-temperature external environment, thereby preventing a piezoelectric deterioration phenomenon in which an electric characteristic deteriorates.

The pair of upper plates 122 are arranged in parallel to each other as large as for example, the width of the lower plate 121, and as a result, the weight body 130 may be placed between the pair of upper plates 122. The weight body 130 as a medium that maximally increases vibration force is inclined upward toward both ends from the center of the weight body 130 in order to prevent contact with the lower plate 121 of the vibration plate 120. Therefore, the upper plate 122 is also inclined upward toward both ends from the center of the upper plate 122 similarly as the shape of the weight body 130.

As described above, in a structure in which the vibration plate 120 includes the upper plate 122, since the weight body 130 does not contact the lower plate 121, the piezoelectric element 123 may be arranged on one flat surface of the lower plate 121.

For reference, the weight body 130 may be made of the metallic material and the weight body 130 is preferably made of a tungsten material having relatively high density in the same volume.

The lower case 140 is formed by a generally elongated planar plate. In this case, the lower case 140 has a size and a shape to close the opened bottom surface of the upper case 110.

The upper case 110 and the lower case 140 may be coupled to each other in various methods such as caulking, welding, and bonding which have already widely been known to those skilled in the art.

Figure 3:
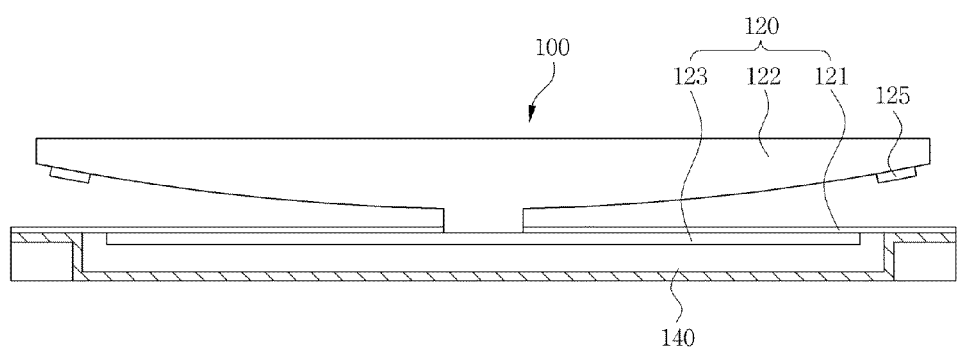
FIG. 3 is a front view schematically illustrating the piezoelectric vibration module according to the first preferred embodiment of the present invention except for an upper case.

FIG. 3 is a front view schematically illustrating the piezoelectric vibration module according to the first preferred embodiment of the present invention except for an upper case.

The vibration plate 120 is spaced apart from the upper plate 122 with a predetermined gap therebetween, particularly, in order to prevent a weight body (not illustrated) and the lower plate 121 from contacting each other as illustrated in the figure.

The vibration plate 120 is spaced apart from the lower case 140 in parallel with each other with a predetermined gap therebetween. Preferably, the lower case 140 fixes the vibration plate 120 through protrusions (with no reference numeral) that are formed vertically at both ends thereof.

As illustrated above, the piezoelectric vibration module 100 according to the first preferred embodiment of the present invention includes first stoppers 125 between both ends of the lower plate 121 and both ends of the upper plate 122. The piezoelectric vibration module 100 according to the present invention includes the first stopper 125 that extends vertically downward around the both ends of the upper plate 122, but may include a first stopper (not illustrated) that extends vertically upward around both ends of the lower plate 121.

Moreover, the first stopper is formed integrally with the upper plate 122 or the lower plate 121. In this case, the first stopper is not limited thereto and may be fixed by various coupling methods.

The first stopper 125 is made of the same material as the upper or lower plate 122 or 121 and is preferably made of a rigid material which is not almost elastically transformed due to a high elastic coefficient thereof. The first stopper 125 of the present invention is not limited thereto and may be made of a flexible material.

In particular, the first stopper 125 may prevent the piezoelectric element 123 from being broken due to direct contact with the lower plate 121 with the piezoelectric element 123 when the piezoelectric vibration module 100 of the present invention is externally shocked, particularly, when the piezoelectric vibration module 100 drops or when the piezoelectric element 123 collides with the internal constituent members (for example, the upper plate) depending on the increase of the driving variation of the piezoelectric element 123. To this end, the first stopper 125 protrudes vertically downward at both ends of the upper plate 122 and extends shorter than a spaced distance between the upper plate 122 and the lower plate 121 so as not to influence driving of the vibration plate 120. That is, the first stopper 125 is spaced apart from the top surface of the lower plate 121 with a predetermined gap therebetween without directly contacting the lower plate 121.

The first stopper 125 is formed to be adjacent to both ends of the upper plate 122, in which the first stopper 125 is placed symmetrically at the center of the upper plate 122.

As a result, an overall collision of the weight body and the lower plate 121 is maximally prevented when the vibration plate 120 moves upward to improve drop reliability by protecting the piezoelectric element 123.

When power is applied to the piezoelectric element 123, the piezoelectric element 123 is fully attached to the lower plate 121, such that a movement occurs at the center of the lower plate 121 through extension or shrinkage deformation. Since the movement occurs while the lower plate 121 is fixed to both ends of the lower case 140, the center of the vibration plate 120 is deformed vertically.

Moreover, the piezoelectric element 123 may be configured to be stacked in a single-layer type or a multi-layer type. The piezoelectric element stacked in the multi-layer type may ensure an electric field required to drive the piezoelectric element even at lower external voltage. Therefore, driving voltage of the piezoelectric vibration module 100 according to the present invention may be lowered, and as a result, in the present invention, the piezoelectric element 123 stacked in the multi-layer type is preferably adopted.

As widely known to those skilled in the art, the piezoelectric element 123 may be made of various materials and particularly, made of polymer.

Figure 4A:
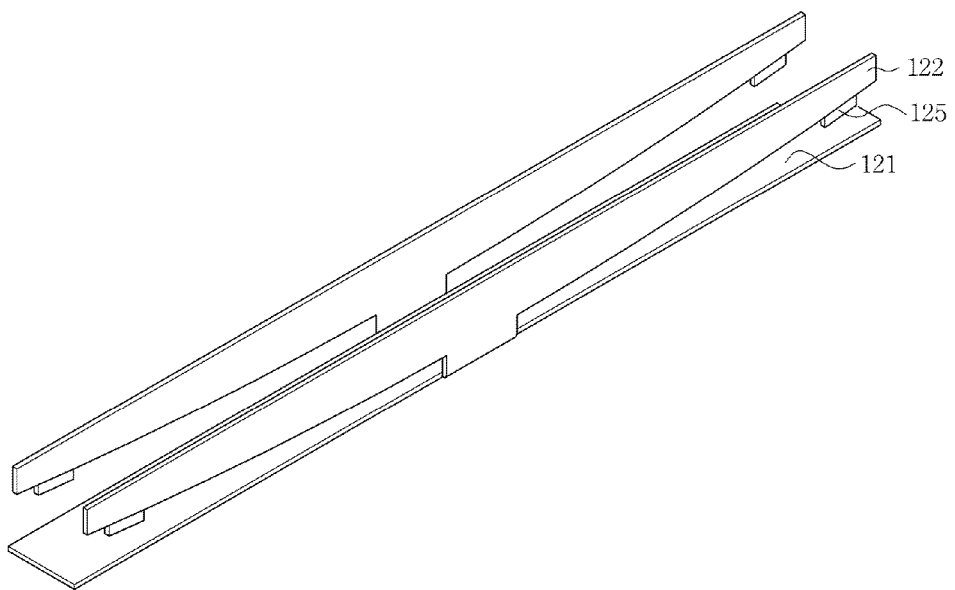
FIG. 4A is a perspective view illustrating one example of a vibration plate illustrated in FIG. 3.

FIG. 4A is a diagram schematically illustrating the vibration plate with one example of the first stopper.

As illustrated in the figure, the first stopper 125 protrudes vertically downward on the bottom surface of the respective upper plates 122 placed in parallel with each other. The first stopper 125 may be formed on only one upper plate 122 of two upper plates 122 or on two upper plates 122. In the latter case, two first stoppers 125 that are arranged in parallel with each other are spaced apart from each other in the same as or smaller than the width of the lower plate 121.

Figure 4B:
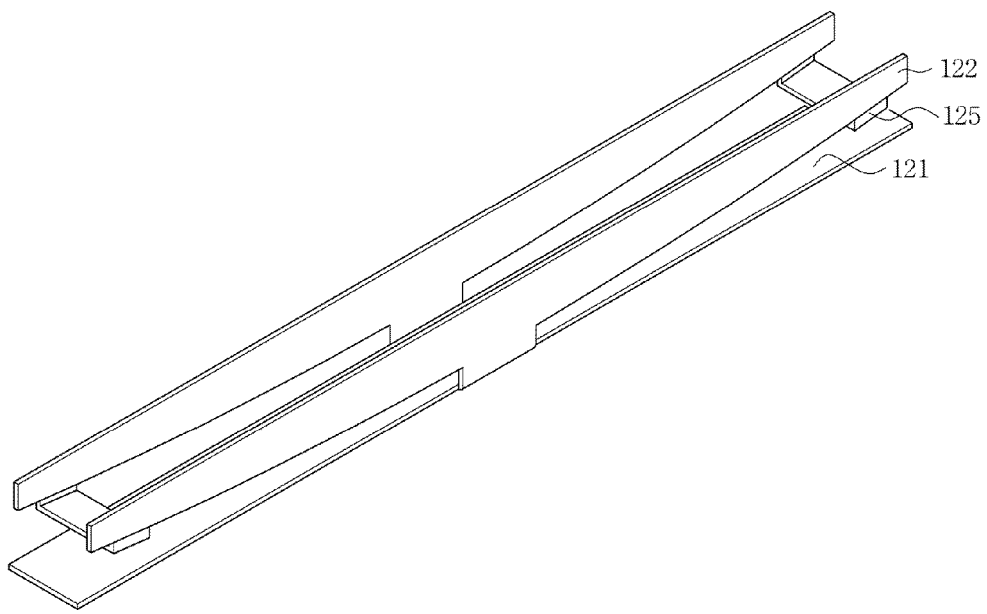
FIG. 4B is a perspective view illustrating another example of a vibration plate illustrated in FIG. 3.

FIG. 4B is a diagram schematically illustrating the vibration plate with another example of the first stopper.

As illustrated in the figure, the first stopper 125 is placed to cross between two upper plates 122 that are placed in parallel with each other, in which the first stopper 125 is formed at both ends of the upper plate 122.

The structure may more certainly support the weight body 130 positioned between two upper plates 122 that are arranged in parallel with each other.

Figure 5A:
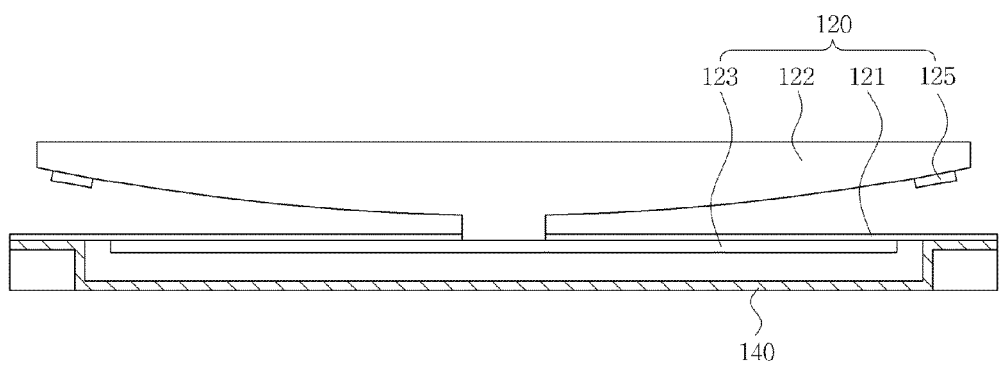
FIGS. 5A to 5C are diagrams illustrating a driving process of the piezoelectric vibration module illustrated in FIG. 3.
Figure 5B:
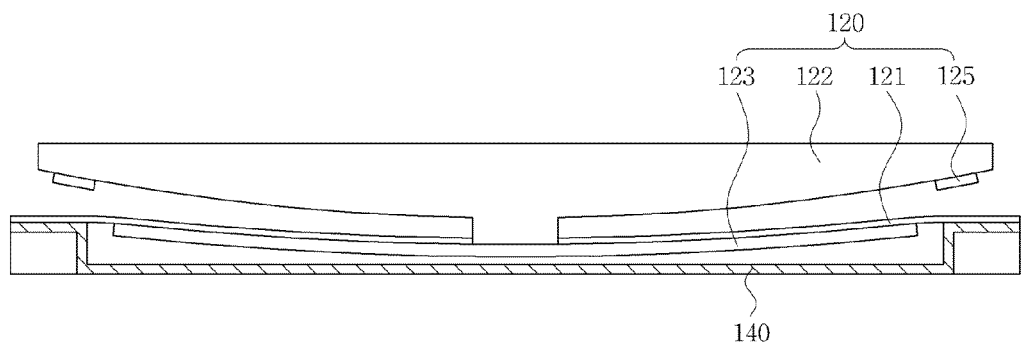
Figure 5C:
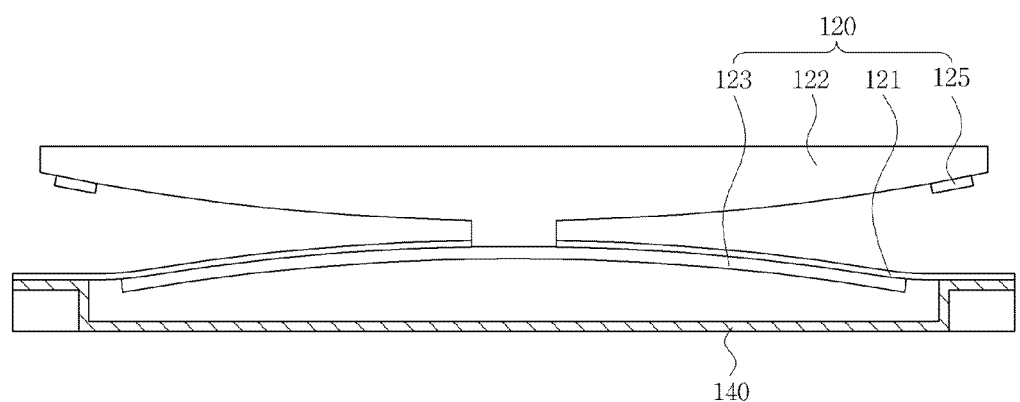

FIGS. 5A to 5C are diagrams illustrating a driving process of the piezoelectric vibration module 100 illustrated in FIG. 3. The piezoelectric vibration module 100 according to the first preferred embodiment of the present invention is coupled to an image display unit such as a touch screen panel or an LCD to transfer vibration force to the outside.

FIG. 5A is a front view of the piezoelectric vibration module 100 illustrating a state before external power is applied. FIG. 5B is a front view of the piezoelectric vibration module 100 in which the length of the piezoelectric element 123 is increased when power is applied. When the length of the piezoelectric element 123 increases, deformation rate of the lower plate 121 is relatively small and the lower plate 121 is fixed to the lower case 140, and as a result, the vibration plate 120 is bent and driven downward. FIG. 5C is a front view of the piezoelectric vibration module 100 in which the lengths of the piezoelectric elements 123a and 123b are decreased when power is applied. When the lengths of the piezoelectric elements 123a and 123b decrease, the lower plate 121 is bent and driven upward.

As illustrated in the figure, a user of a haptic device with the piezoelectric element 123 may sense vibration feedback by vertical vibration.

Figure 6:
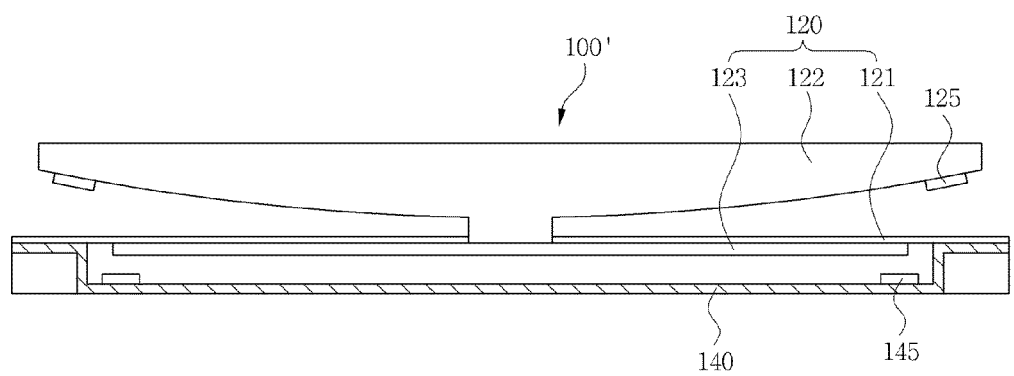
FIG. 6 is a diagram schematically illustrating a piezoelectric vibration module according to a second preferred embodiment of the present invention.

As illustrated in FIG. 6, a piezoelectric vibration module 100' according to a second preferred embodiment of the present invention includes a second stopper 145 in the lower case 140. The second stopper 145 is formed integrally with the lower case 140. In this case, the second stopper 145 is not limited thereto, however, the second stopper 145 may be fixed by various coupling methods.

Referring to FIG. 6, the second stopper 145 may be formed at both ends of the lower case 140, that is, around the protrusion. Therefore, preferably, the second stopper 145 should extend shorter than a spaced distance between the lower case 140 and the lower plate 121 so as not to influence driving of the lower plate 121.

Moreover, the second stopper 145 extends more than the thickness of the piezoelectric element 123 attached to the lower plate 121, such that the piezoelectric element 123 attached to the lower plate 121 does not contact the lower case 140 in unexpected driving variation of the lower plate 121. Further, the second stopper 145 should be placed so as not to influence coupling of the lower case 140 and the upper case 110 (see FIG. 2) as well as contact or collide with the piezoelectric element 123.

Although not illustrated, the second stopper 145 may protrude vertically upward at the center of the lower case 140 and as described above, the second stopper 145 should protrude shorter than the spaced distance between the lower case 140 and the lower plate 121 and more preferably, the second stopper 145 should extend vertically upward so as not to influence normal driving variation of the lower plate 121.

The piezoelectric vibration module 100' according to the second preferred embodiment of the present invention includes the second stopper 145 together with the first stopper 125 provided between the upper plate 122 and the lower plate 121 similarly as the piezoelectric vibration module 100 according to the first preferred embodiment of the present invention to illustrated in FIG. 3. Therefore, the vertical movement distance of the vibration plate 120 is reduced to improve drop reliability by protecting the piezoelectric element 123.

According to the preferred embodiments of the present invention, there is provided a piezoelectric vibration module that can prevent a driving body configured by a piezoelectric element capable of providing vibration force from directly colliding with internal constituent members.

The piezoelectric vibration module includes a collision absorbing member that can protect the piezoelectric element without influencing the vibration force generated by activation of the piezoelectric element.

In particular, variation of the piezoelectric element and/or a vibration plate that move vertically is limited to achieve structural stability.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A piezoelectric vibration module, comprising:
a piezoelectric element generating vibration force through repetition of extension and shrinkage deformation by applying external power;
an upper case having a bottom surface opened and an inner space formed therein;
a lower case coupled to the bottom surface of the upper case and shielding the inner space of the upper case; and
a vibration plate including a flat lower plate mounted with the piezoelectric element, a pair of upper plates that stand vertically upward at the centers of the both sides of the lower plate, and a first stopper between the upper plate and the lower plate, which is placed in the upper case and the lower case and driven vertically.

2. The piezoelectric vibration module as set forth in claim 1, wherein the vibration plate further includes a weight body placed between the pair of upper plates in order to increase vibration force of the piezoelectric element.

3. The piezoelectric vibration module as set forth in claim 1, wherein the length of the first stopper extends shorter than a spaced distance between the upper plate and the lower plate.

4. The piezoelectric vibration module as set forth in claim 1, wherein the first stopper protrudes vertically downward on the bottom surfaces of both ends of the upper plate.

5. The piezoelectric vibration module as set forth in claim 1, wherein the first stopper protrudes vertically upward on the top surfaces of both ends of the lower plate.

6. The piezoelectric vibration module as set forth in claim 4, wherein the first stopper protrudes on one upper plate of the pair of upper plates.

7. The piezoelectric vibration module as set forth in claim 4, wherein the first stopper is arranged by crossing between the pair of upper plates that are arranged in parallel with each other.

8. The piezoelectric vibration module as set forth in claim 1, wherein the first stopper is made of the same material as the vibration plate.

9. The piezoelectric vibration module as set forth in claim 1, wherein the first stopper is to made of a rigid material.

10. A piezoelectric vibration module, comprising:
a piezoelectric element generating vibration force through repetition of extension and shrinkage deformation by applying external power;
an upper case having a bottom surface opened and an inner space formed therein;
a lower case including a second stopper that extends vertically upward and coupled to the bottom surface of the upper case and shielding the inner space of the upper case; and
a vibration plate including a flat lower plate mounted with the piezoelectric element and a pair of upper plates that stand vertically upward at the centers of the both sides of the lower plate, which is placed in the upper case and the lower case and driven vertically.

11. The piezoelectric vibration module as set forth in claim 10, wherein the lower case further includes protrusions that protrude vertically upward at both ends thereof.

12. The piezoelectric vibration module as set forth in claim 10, wherein the vibration plate further includes a first stopper placed between the upper plate and the lower plate.

13. The piezoelectric vibration module as set forth in claim 10, wherein a second stopper is placed at both ends of the lower case.

14. The piezoelectric vibration module as set forth in claim 10, wherein the second stopper is placed at the center of the edge of the longitudinal direction of the lower case.

15. The piezoelectric vibration module as set forth in claim 10, wherein the second stopper extends shorter than a spaced distance between the lower plate and the lower case.

16. The piezoelectric vibration module as set forth in claim 10, wherein the second stopper is made of the same material as the vibration plate.

17. The piezoelectric vibration module as set forth in claim 10, wherein the second stopper is made of a rigid material.

18. The piezoelectric vibration module as set forth in claim 10, wherein the second stopper extends more than the thickness of the piezoelectric element.

* * * * *